(12) United States Patent
Yanagi et al.

(10) Patent No.: US 10,917,080 B2
(45) Date of Patent: Feb. 9, 2021

(54) GATE DRIVE CIRCUIT

(71) Applicant: ROHM CO., LTD., Kyoto (JP)

(72) Inventors: Tatsuya Yanagi, Kyoto (JP); Hirotaka Otake, Kyoto (JP); Takashi Sawada, Kyoto (JP); Seiya Kitagawa, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 15/474,223

(22) Filed: Mar. 30, 2017

(65) Prior Publication Data
US 2017/0288657 A1   Oct. 5, 2017

(30) Foreign Application Priority Data

Mar. 30, 2016  (JP) ................................. 2016-067602

(51) Int. Cl.
  *H03K 17/04*     (2006.01)
  *H01L 29/78*     (2006.01)
  (Continued)

(52) U.S. Cl.
  CPC .......... *H03K 17/04* (2013.01); *H01L 29/7802* (2013.01); *H01L 29/7805* (2013.01); *H03K 17/04123* (2013.01); *H01L 29/1608* (2013.01)

(58) Field of Classification Search
  CPC .. H03K 17/00; H03K 17/04; H03K 17/04126; H03K 17/063; H03K 17/0826;
  (Continued)

(56) References Cited

U.S. PATENT DOCUMENTS

2005/0248384 A1*  11/2005  Miettinen .......... H03K 17/0406
                                                          327/434
2008/0018376 A1*   1/2008  Godes .............. H03K 17/04123
                                                          327/376
(Continued)

FOREIGN PATENT DOCUMENTS

JP    H03-078313    4/1991
JP    2000-216671   8/2000
(Continued)

OTHER PUBLICATIONS

Japanese Patent Office, Office Action in Japanese Appln. No. 2016-067602, dated Dec. 10, 2020, 6 pages (with English Translation).

*Primary Examiner* — Lincoln D Donovan
*Assistant Examiner* — Dave Mattison
(74) *Attorney, Agent, or Firm* — Fish & Richardson P.C.

(57) ABSTRACT

A gate drive circuit has a capacitor and a gate drive voltage source connected in series with a gate terminal of a voltage-driven switching device. The gate drive source voltage feeds, as a gate drive voltage, a voltage higher than the sum of the voltage applied to a gate-source parasitic capacitance of the switching device when the switching device is in a steady ON state and the voltage applied to, of any circuit component interposed between the gate drive voltage source and the gate terminal of the switching device, a circuit component other than the capacitor (such as an upper transistor forming the output stage of the driver). No other circuit component (such as a resistor connected in parallel with the capacitor) is essential but the capacitor as the sole circuit component to be directly connected to the gate terminal of the switching device.

7 Claims, 14 Drawing Sheets

(51) Int. Cl.
*H03K 17/0412* (2006.01)
*H01L 29/16* (2006.01)

(58) Field of Classification Search
CPC ............. H03K 17/601; H03K 2217/00; H03K 2217/0036; H01L 29/00; H01L 29/1608; H01L 29/7805
USPC ........................................................ 327/109
See application file for complete search history.

(56) References Cited

U.S. PATENT DOCUMENTS

| | | | |
|---|---|---|---|
| 2010/0283515 A1* | 11/2010 | Kelley | H03K 17/04123 327/109 |
| 2011/0230032 A1 | 9/2011 | Harris | |
| 2013/0214822 A1* | 8/2013 | Sakata | H03K 17/223 327/109 |
| 2015/0288356 A1* | 10/2015 | Sicard | H03K 17/567 327/382 |
| 2016/0056813 A1* | 2/2016 | Vice | H03K 17/602 330/297 |
| 2016/0072498 A1 | 3/2016 | Hwang | |

FOREIGN PATENT DOCUMENTS

| | | |
|---|---|---|
| JP | 2008-235952 | 10/2008 |
| JP | 2009-200891 | 9/2009 |
| JP | 2010-051165 | 3/2010 |
| JP | 4804142 | 8/2011 |
| JP | 2016-040967 | 3/2016 |

* cited by examiner

GATE DRIVE CIRCUIT

This application is based on Japanese Patent Application No. 2016-067602 filed on Mar. 30, 2016, the contents of which are hereby incorporated by reference.

BACKGROUND OF THE INVENTION

1. Field of the Invention

The present invention relates to gate drive circuits.

2. Description of Related Art

Conventionally, in gate drive circuits that switch a switching device such as a switching power source or a motor driver, there have been proposed methods for achieving high-speed switching by temporarily varying the gate voltage of the switching device only for the moment of switching (see, for example, Patent Document 1 (Japanese Patent Application Publication No. 2009-200891), Patent Document 2 (Japanese Patent No. 4804142), and Patent Document 3 (Japanese Patent Application Publication No. 2010-51165)).

However, in Patent Document 1, as a means for temporarily raising the gate voltage, an extremely large number of passive components are required; this inconveniently leads to an increased circuit scale.

In Patent Document 2, the gate voltage is temporarily raised by switching among a plurality of power sources; inconveniently, this not only leads to an increased circuit scale but also necessitates complicated control.

In Patent Document 3, a current-driven switching device (junction FET) that has to keep the gate current passing even in a steady ON state is taken as a driving target. Thus, the capacitor proposed in this document is just for being connected in parallel with a gate resistor which is an essential circuit component, and is not at all intended to be used by itself. In this respect, the conventional technology disclosed in Patent Document 3 may seem similar to but is quite different from the present invention which is disclosed herein, exhibiting a clear difference in basic configuration.

SUMMARY OF THE INVENTION

To cope with the above-mentioned problems encountered by the present inventors, the present invention aims to provide a gate drive circuit that can easily achieve high-speed switching.

According one aspect of the present invention, a gate drive circuit has a first capacitor and a first gate drive voltage source connected in series with a gate terminal of a switching device of a voltage-driven type. The first gate drive voltage source is configured to feed, as a first gate drive voltage, a voltage higher than the sum of the voltage applied to the gate-source (emitter) parasitic capacitance of the switching device when the switching device is in a steady ON state and the voltage applied to, of any circuit component interposed between the first gate drive voltage source and the gate terminal of the switching device, a circuit component other than the first capacitor.

According to another aspect of the present invention, a gate drive circuit has a capacitor and a gate drive voltage source connected in series with a gate terminal of a switching device of a voltage-driven type. The capacitor is the sole circuit component directly connected to the gate terminal of the switching device.

Other features, elements, steps, benefits, and characteristics of the present invention will become clearer with reference to the following description of preferred embodiments thereof in conjunction with the accompanying drawings.

DETAILED DESCRIPTION OF PREFERRED EMBODIMENTS

Reference Example

Figure 1:
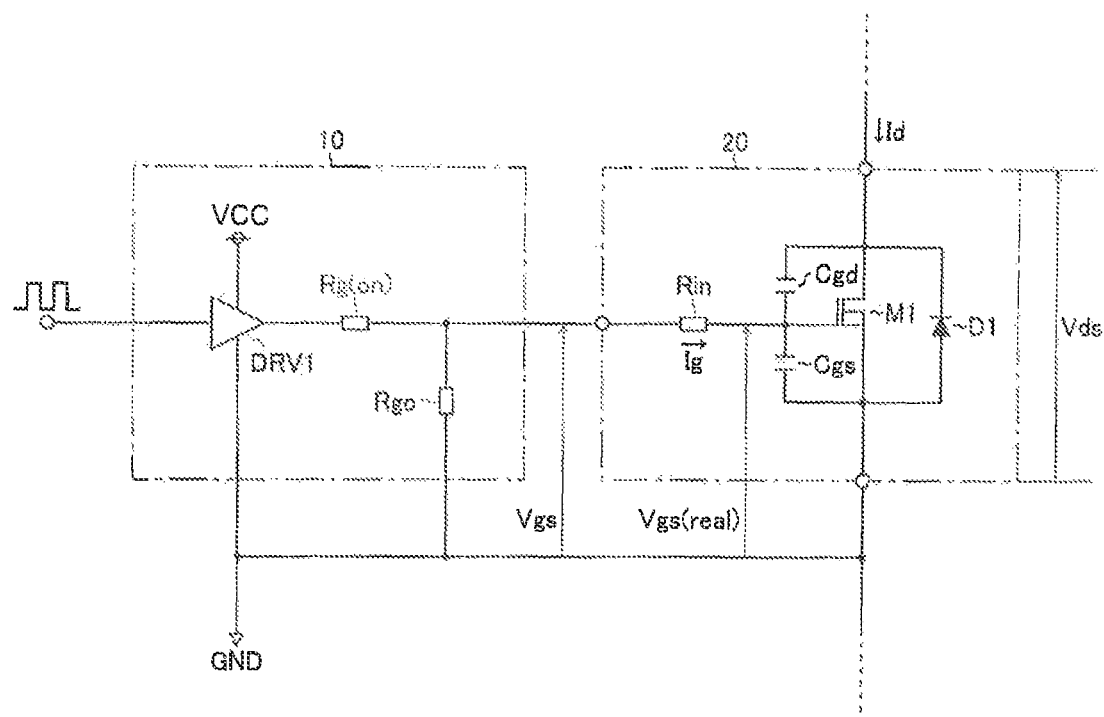
FIG. 1 is an equivalent circuit diagram showing one reference example of a gate drive circuit for comparison with the present invention.

Before a description is given of the present invention, one reference example of a gate drive circuit, which should be compared with the present invention, will be described. FIG. 1 is an equivalent circuit diagram showing one reference example of a gate drive circuit. The gate drive circuit 10 according to the reference example is an analog circuit for driving a discrete switching device 20, and has a driver DRV1, an externally-fitted gate resistor Rg(on), and a discharge resistor Rgo.

The driver DRV1 outputs, according to the logic level of a control signal fed to it, a binary voltage (equal to a source voltage VCC or a ground voltage GND at a time) from an output terminal of the driver DRV1, and thereby voltage-drives a gate terminal of the switching device 20.

The externally-fitted gate resistor Rg(on) is connected between the output terminal of the driver DRV1 and the gate terminal of the switching device 20. The discharge resistor Rgo is connected between the gate terminal of the switching device 20 and a ground (GND). The external externally-fitted gate resistor Rg(on) and the discharge resistor Rgo have the relationship Rg(on)<<Rgo.

The switching device 20 is a semiconductor switching device that is switched by the gate drive circuit 10. Here, an N-channel MOS (metal-oxide-semiconductor) field-effect transistor M1 is used as the switching device 20.

As equivalently shown in FIG. 1, between the gate and the source of the transistor M1, a gate-source parasitic capacitance Cgs is present, and between the gate and the drain of the transistor M1, a gate-drain parasitic capacitance Cgd is present. The input capacitance Ciss of the transistor M1 can be expressed as the sum of the gate-source parasitic capacitance Cgs and the gate-drain parasitic capacitance Cgd (Cgs+Cgd).

In the gate of the transistor M1, an inner gate resistance Rin is present, and between the drain and the source of the transistor M1, a body diode D1 with a polarity as shown in FIG. 1 is present. Although a parasitic inductance is also present in the transistor M1, here, for the sake of simple illustration, it will be omitted from illustration and description.

Different voltages and currents in the switching device 20 are represented as follows. Vgs represents the gate-source voltage, Vgs(real) represents the voltage across the gate-source parasitic capacitance Cgs, Vds represents the drain-source voltage, Id represents the drain current, and Ig represents the gate current. When the gate current Ig passes, a voltage (Ig×Rin) occurs across the inner gate resistance Rin; thus, Vgs≠Vgs(real). On the other hand, when no gate current Ig passes, the voltage across the inner gate resistance Rin has a zero value; thus, Vgs=Vgs(real) if the parasitic inductance is ignored.

Figure 2:
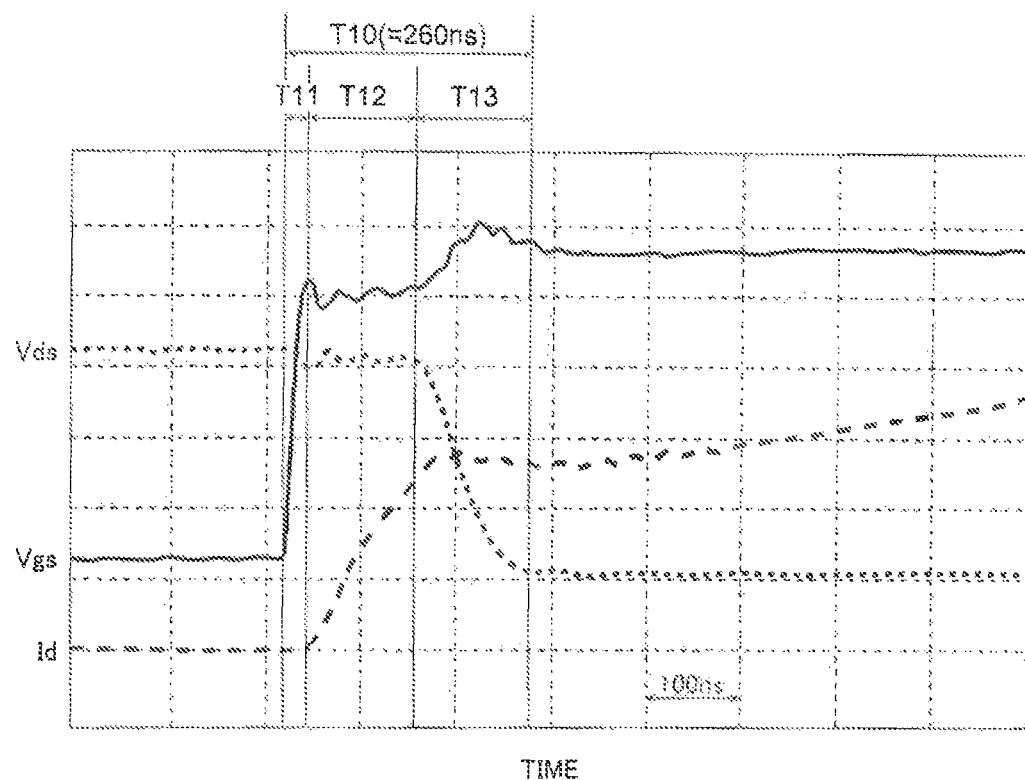
FIG. 2 is a switching waveform diagram showing a turn-ON transient characteristic in the reference example.

FIG. 2 is a switching waveform diagram showing the turn-ON transient characteristic of the switching device 20 according to the reference example. In FIG. 2, the solid line represents the gate-source voltage Vgs, the dotted line represents the drain-source voltage Vds, and the dashed line represents the drain current Id. The scale of the horizontal axis is 100 ns/div. The scales of the vertical axes are 5 V/div for Vgs, 200 V/div for Vds, and 20 A/div for Id.

FIG. 2 shows the transient characteristic of the switching device 20 observed, in an application where a high-withstand-voltage SiC-MOSFET (rated at 1200 V) is used as the switching device 20 and an inductive load (such as a coil) is connected to it, when the switching device 20 is turned ON under the conditions VCC=18 V, Rg(on)=0.01Ω, and Rgo=4.7 kΩ (conditions with Rg(on) reduced to the limit for increased switching speed).

In actual measurement, it has been confirmed that, under the conditions mentioned above, the turn-ON period T10 of the switching device 20 (the period of time required for the switching device 20 to turn from OFF to ON) is approximately 260 ns (about 3.8 MHz). Now, this turn-ON period T10 is split roughly into three periods T11 to T13 in chronological order, and these will be described in detail one by one.

First, the period T11 will be described. The period T11 corresponds to the period in which Vgs(real)<Vth holds (where Vth represents the ON-threshold voltage of the transistor M1). In this period T11, while the drain current Id is kept at a zero value, the gate-source voltage Vgs (Vgs(real)) increases with a predetermined time constant τ ((Rg(on)+Rin)×Ciss).

Next, the period T12 will be described. The period T12 corresponds to the period in which Vth≤Vgs(real)<Vp holds (where Vp represents the plateau voltage observed with the drain current Id of the transistor M1 at a steady-state value). Here, the steady-state value of the drain current Id is the value of the current that was passing through the inductive load before switching. In this period T12, while the drain-source voltage Vds is kept constant, the drain current Id increases. The period T12 ends when the drain current Id reaches the steady-state value.

Here, the SiC-MOSFET generally has a mutual conductance lower than the mutual conductance of the Si-MOSFET, and the plateau voltage Vp tends to increase as the drain current Id increases. This aspect will now be described in detail with reference to FIG. 3.

Figure 3:
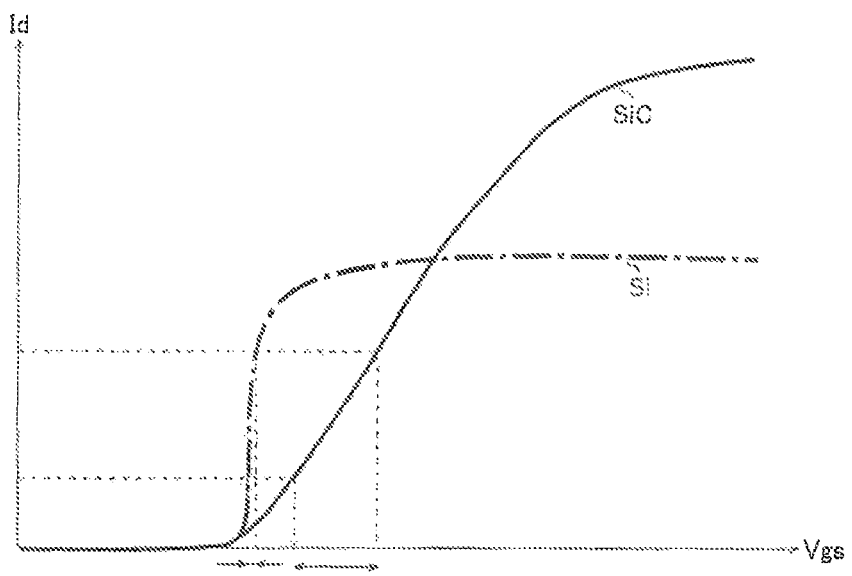
FIG. 3 is a diagram of Id-Vgs characteristics.

FIG. 3 is a diagram of Id-Vgs characteristics, where the vertical axis represents the drain current Id and the horizontal axis represents the gate-source voltage Vgs. The solid line represents the Id-Vgs characteristic of the SiC-MOSFET, and the dash-dot line represents the Id-Vgs characteristic of the Si-MOSFET.

As mentioned above, the mutual conductance of the SiC-MOSFET is generally lower than the mutual conductance of the Si-MOSFET. Thus, the SiC-MOSFET has a gentler gradient of the Id-Vgs characteristic (solid line) (d(Id)/d(Vgs)) as compared with the Si-MOSFET.

Thus, the gate-source voltage Vgs (dash-dot line) of the Si-MOSFET hardly varies even when the drain current Id varies, whereas the gate-source voltage Vgs (solid line) of the SiC-MOSFET varies greatly according to the drain current Id.

Thus, with the SiC-MOSFET, the higher the drain current Id is, the higher the plateau voltage Vp is. As a result, the transition timing to the plateau region (the transition timing from the period T12 to the period T13) is delayed; this prolongs the turn-ON period T10 of the switching device 20.

Back in FIG. 2, the period T13 (the plateau region) will be described. The period T13 corresponds to the period in which Vgs(real)=Vp holds. In this period T13, while the gate-source voltage Vgs is kept constant, the drain-source voltage Vds decreases.

Here, with the SiC-MOSFET, as mentioned above, the higher the drain current Id is, the higher the plateau voltage Vp is, and this reduces the difference between the gate-source voltage Vgs (VCC) applied to the switching device 20 and the plateau voltage Vp (Vgs(real)). As a result, the gate current Ig ((Vgs−Vp)/(Rg(on)+Rin)) decreases; this prolongs the charge time of the gate-drain parasitic capacitance Cgd and prolongs the period T13 (hence prolonging the turn-ON period T10). In particular, the higher the inner gate resistance Rin is, the lower the gate current Ig is; this prolongs the above-described periods T12 and T13.

For example, when the switching device 20 is applied to a switching power supply, certainly, driving the switching device 20 at a high frequency (for example, 100 kHz or higher) contributes to reducing the size of passive components. However, as the turn-ON period T10 and the turn-OFF period (the time after the gate-source voltage Vgs starts to fall until the drain current Id reaches zero A) of the switching device 20 become longer, the switching loss may increase and the dead time that needs to be secured may increase; thus, for high-frequency driving of the switching device 20, it is very important to achieve high-speed switching of the switching device 20.

Increasing the gate-source voltage Vgs applied to the switching device 20 when it turns ON increases the gate current Ig, and it is thus possible to shorten the periods T12 and T13 (and hence the turn-ON period T10). However, from the perspective of prevention of device destruction, when the switching device 20 is in a steady ON state, it is inadvisable to keep applying a gate-source voltage Vgs higher than a DC rated voltage (for example, 22 V) to the switching device 20.

Thus, in the embodiments described below, a gate drive circuit 10 will be proposed that achieves high speed switching by temporarily raising the gate-source voltage Vgs of a switching device 20 only for a moment when it turns ON.

First Embodiment

Figure 4:
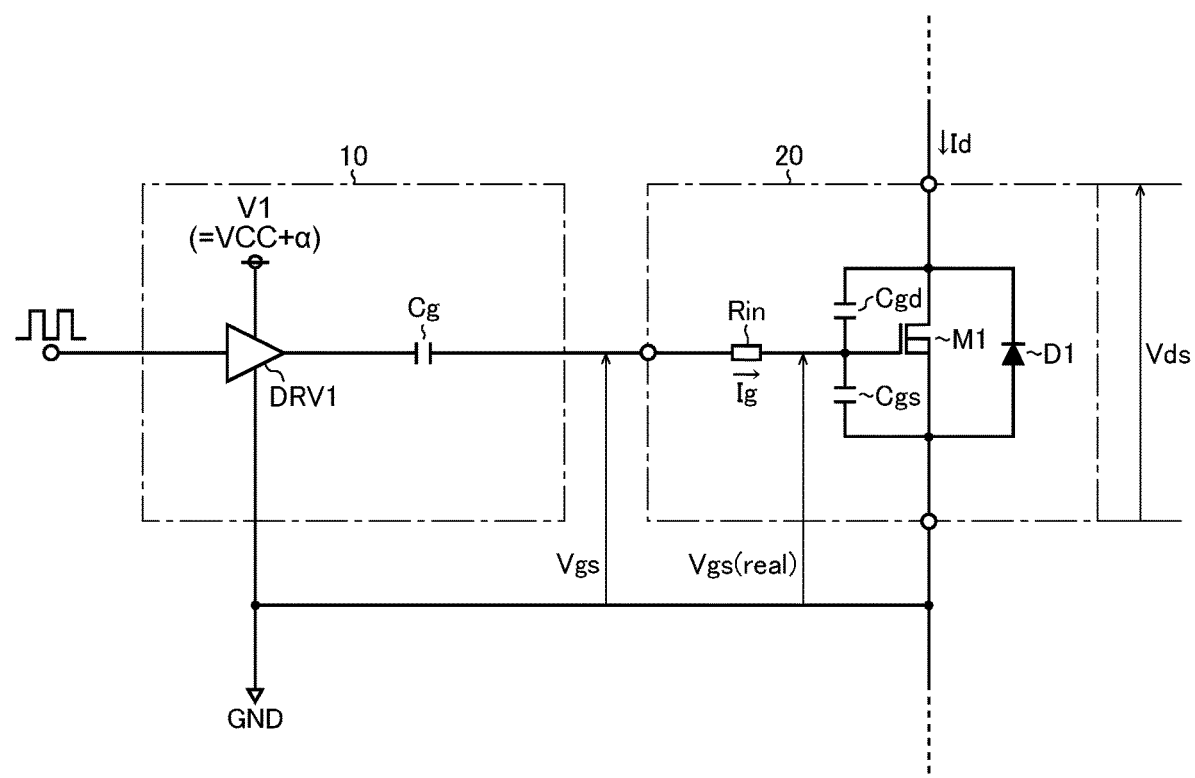
FIG. 4 is an equivalent circuit diagram showing a gate drive circuit according to a first embodiment.

FIG. 4 is an equivalent circuit diagram showing a gate drive circuit 10 according to a first embodiment. The gate drive circuit 10 according to this embodiment is an analog circuit for driving a voltage-driven switching device 20 (for example a SiC-MOSFET) like the reference example (FIG. 1) described above, and has, in addition to the driver DRV1 mentioned above, a capacitor Cg connected in series with a gate terminal of the switching device 20 and a gate drive voltage source V1.

The driver DRV1 outputs, according to the logic level of a pulse control signal fed to it, a binary voltage (equal to a gate drive voltage (VCC+α) or a ground voltage GND at a time) from an output terminal of the driver DRV1, and thereby voltage-drives the gate terminal of the switching device 20.

The capacitor Cg is connected between the output terminal of the driver DRV1 and the gate terminal of the switching device 20. In particular, in the gate drive circuit 10 according to this embodiment, which is directed to a voltage-driven switching device 20 as the driving target, it is unnecessary to keep the gate current Ig passing when the switching device 20 is in a steady ON state. Thus, the capacitor Cg is the sole essential circuit component that needs to be directly connected in series with the gate terminal of the switching device 20.

In the steady ON state, the voltage applied to the gate-source parasitic capacitance Cgs is determined by the capacitance ratio between the capacitor Cg and the gate-source parasitic capacitance Cg. Thus, the capacitor Cg is preferably designed such that, in the steady ON state, the voltage applied to the gate-source parasitic capacitance Cgs is equal to or lower than the DC rated voltage. For example, with a SiC-MOSFET, seeing that the capacitance value of the gate-source parasitic capacitance Cgs is approximately 2 nF, the capacitor Cg is preferably designed to have a capacitance value of, for example, approximately 30 nF.

The gate drive voltage source V1 feeds a gate drive voltage (VCC+α) (for example 23 V), which is higher than the source voltage VCC (for example 18 V), to the driver DRV1.

More specifically, let the voltage applied across the gate-source parasitic capacitance Cgs when the switching device 20 is in the steady ON state be Vx, and let the voltage applied to, of the circuit components interposed between the gate drive voltage source V1 and the gate terminal of the switching device 20, those other than the capacitor Cg (such as an upper transistor forming the output stage of the driver DRV1) be Vy, then the gate drive voltage source V1 can feed, as the gate drive voltage (VCC+α), a voltage substantially higher than the sum of the above-mentioned voltages (Vx+Vy).

That is, in the gate drive voltage source V1, the voltage value of the gate drive voltage (VCC+α) can be previously set appropriately so that the voltage across the capacitor Cg does not have a practically zero value even when the switching device 20 is in the steady ON state.

In a conventional gate drive circuit, a speed-up capacitor is often used that is connected in parallel with a gate resistor (see Rg(on) in FIG. 1). However, when a switching device is in a steady ON state, no gate current passes through the gate resistor, and thus the voltage across the speed-up capacitor has a zero value. It can be said that, in this respect, the above-mentioned capacitor Cg and the conventional speed-up capacitor are completely different from each other. Of course, the voltage across the speed-up capacitor does not have a completely zero value due to the effect of current leakage or the like, but can be regarded as having a substantially zero value.

When the switching of the switching device 20 is driven by use of the gate drive circuit 10 configured as described above, immediately after the switching device 20 turns ON, the gate current Ig passes from the gate drive voltage source V1 via the capacitor Cg. Here, at the start of the operation, no voltage is applied across the capacitor Cg, and thus the gate drive voltage (VCC+α) is applied, substantially as it is, as the gate-source voltage Vgs of the switching device 20. As a result, the gate input capacitance Ciss is charged by use of the gate drive voltage (VCC+α), and this makes it possible to turn ON the switching device 20 at high speed.

Thereafter, when the switching device 20 reaches the steady ON state (the state in which no gate current Ig passes), the gate-source voltage Vgs (Vgs(real)) of the switching device 20 settles at a voltage value that is determined by the capacitance ratio between the capacitor Cg and the gate-source parasitic capacitance Cgs.

For example, the capacitance ratio between the capacitor Cg and the gate-source parasitic capacitance Cgs can be previously adjusted appropriately so that, when the switching device 20 is in the steady ON state, the source voltage VCC is applied across the gate-source parasitic capacitance Cgs and the voltage α is applied across the capacitor Cg.

Figure 5:
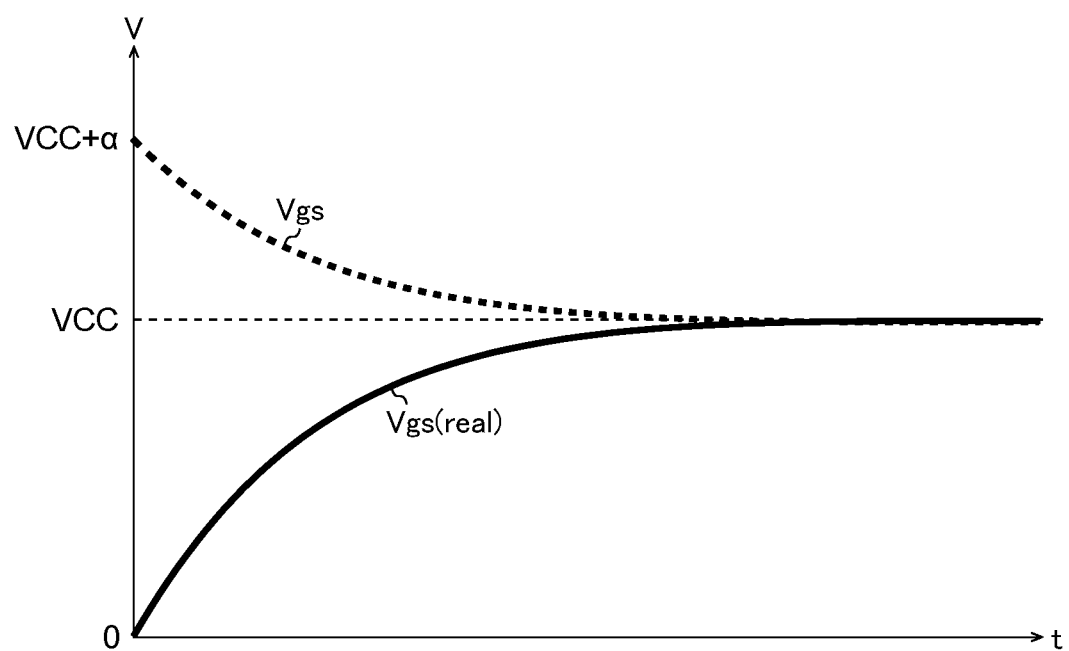
FIG. 5 is a voltage waveform diagram showing the turn-ON behavior of Vgs and Vgs(real)

FIG. 5 is a voltage waveform diagram showing the turn-ON behavior of the Vgs and Vgs(real) described above. In FIG. 5, the broken line represents the turn-ON behavior of the gate-source voltage Vgs, and the solid line represents the turn-ON behavior of the voltage Vgs(real) across the gate-source parasitic capacitance Cgs.

As described above, right after the switching device 20 turns ON, the gate drive voltage (VCC+α) is applied, substantially as it is, as the gate-source voltage Vgs. On the other hand, the voltage Vgs(real) across the gate-source parasitic capacitance Cgs rises from a zero value. Thereafter, when the switching device 20 reaches the steady ON state, the voltages both settle at the source voltage VCC.

Thus, with the gate drive circuit 10 according to this embodiment, it is possible, with no need for an increased circuit scale or complicated control, to temporarily raise the gate-source voltage Vgs of the switching device 20 only for a moment when it turns ON. Thus, with a very simple configuration, high-speed switching of the switching device 20 can be achieved.

From the perspective of prevention of device destruction, between the gate and source of the switching device 20, a rated DC voltage VA (the voltage that is permitted to be applied constantly) and a rated surge voltage VB (the voltage that is permitted to be applied momentarily) are determined. Considering this, the gate drive voltage (VCC+α) is preferably set at a voltage value higher than the rated DC voltage VA but lower than the rated surge voltage VB (VA<(VCC+α)<VB). For example, when VA=22 V and VB=26 V, the gate drive voltage (VCC+α) can be set between 23 V and 25 V, inclusive.

The voltage Vgs(real) (for example Vgs(real)=VCC) applied across the gate-source parasitic capacitance Cgs when the switching device 20 is in the steady ON state can be previously set at a voltage value (for example 18 V) which is lower than the above-mentioned rated DC voltage VA and which permits the ON resistance value of the switching device 20 to be sufficiently lowered.

By making settings as described above, it is possible to increase the switching speed of the switching device 20 as much as possible within the rated operation range of the switching device 20.

Figure 6:
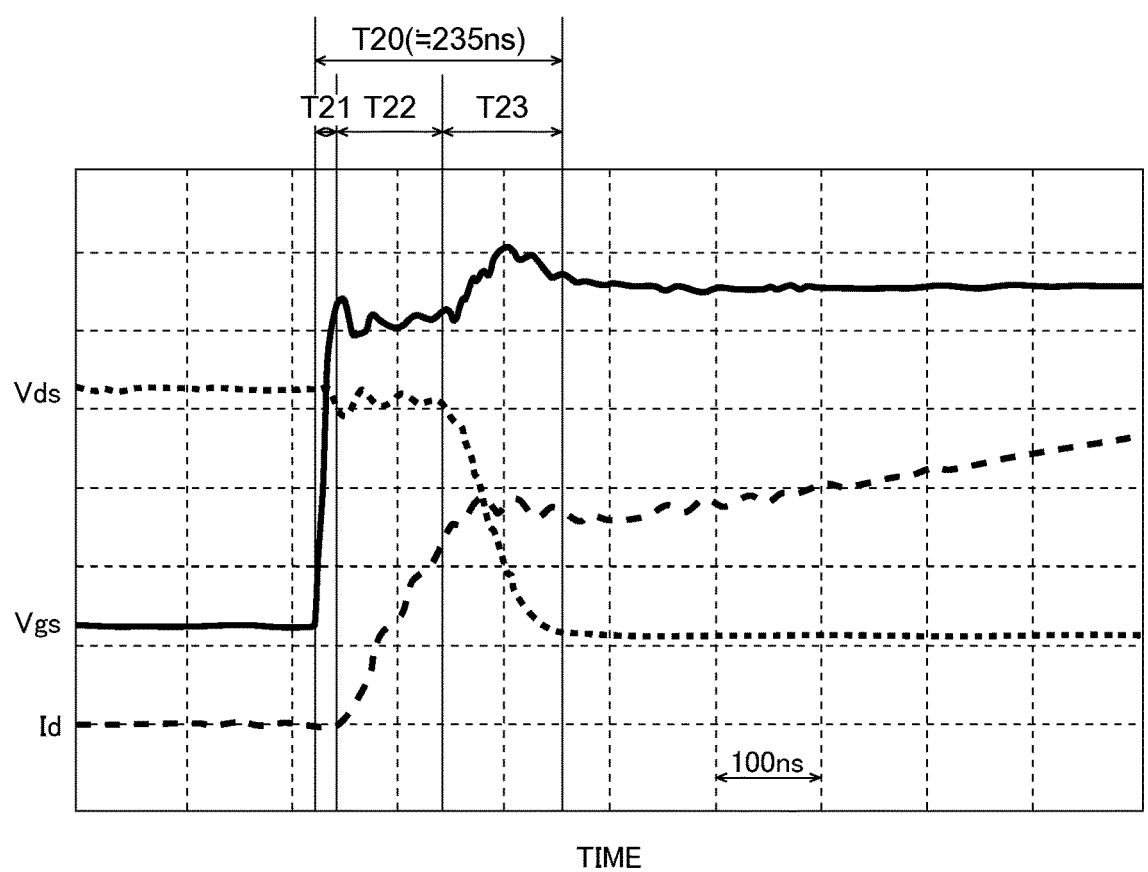
FIG. 6 is a switching waveform diagram showing a turn-ON transient characteristic in the first embodiment.

FIG. 6 is a switching waveform diagram showing the turn-ON transient characteristic of the switching device 20 according to the first embodiment. As in FIG. 2 above, in FIG. 6, the solid line represents the gate-source voltage Vgs, the dotted line represents the drain-source voltage Vds, and the dashed line represents the drain current Id. The scale of the horizontal axis is 100 ns/div. The scales of the vertical axes are 5 V/div for Vgs, 200 V/div for Vds, and 20 A/div for Id.

FIG. 6 shows the transient characteristic of the switching device 20 observed, in an application where a high-withstand-voltage SiC-MOSFET (rated at 1200 V) is used as the switching device 20 and an inductive load (such as a coil) is connected to it, when the switching device 20 is turned ON under the conditions (VCC+α)=23 V and Cg=30 nF.

In FIG. 6, the turn-ON period T20 is split roughly into three periods T21 to T23 in chronological order like the turn-ON period T10 in FIG. 2, and the periods T21 to T23 in FIG. 6 correspond to the periods T11 to T13 in FIG. 2 respectively.

In actual measurement, it has been confirmed that, under the conditions mentioned above, the turn-ON period T20 of the switching device 20 is approximately 235 ns. That is, with the gate drive circuit 10 according to the first embodiment, as compared with the reference example described above (see FIGS. 1 and 2), it is possible to shorten the turn-ON period T20 of the switching device 20 by 10% (from T10=260 ns to T20=235 ns).

Although the above description deals with an example where the SiC-MOSFET is used as the switching device 20, the effects described above have nothing to do with the material or structure of the switching device 20; thus, also with, for example, a SiC-MOSFET, a Si-IGBT (insulated-gate bipolar transistor), or a SiC-IGBT, the switching speed thereof is expected to be improved likewise. This ensures wide application in gate drive circuits in general having a voltage-driven switching device as a driving target. When an IGBT is taken as a driving target, in the mentions of the terminals of the transistor M1 in the description above, "source" can be read as "emitter" and "drain" can be read as "collector".

It is considered that as a result of the SiC-MOSFET having a mutual conductance lower than that of the Si-MOSFET and thus having a longer turn-ON period in an application where the drain current Id is high as described above, with the SiC-MOSFET, the above-described configuration provides a stronger effect of enhancing the switching speed. In view of the above, it can be said that the configuration according to this embodiment is suitable, particularly, to a gate drive circuit that drives a SiC-based switching device.

Second Embodiment

Figure 7:
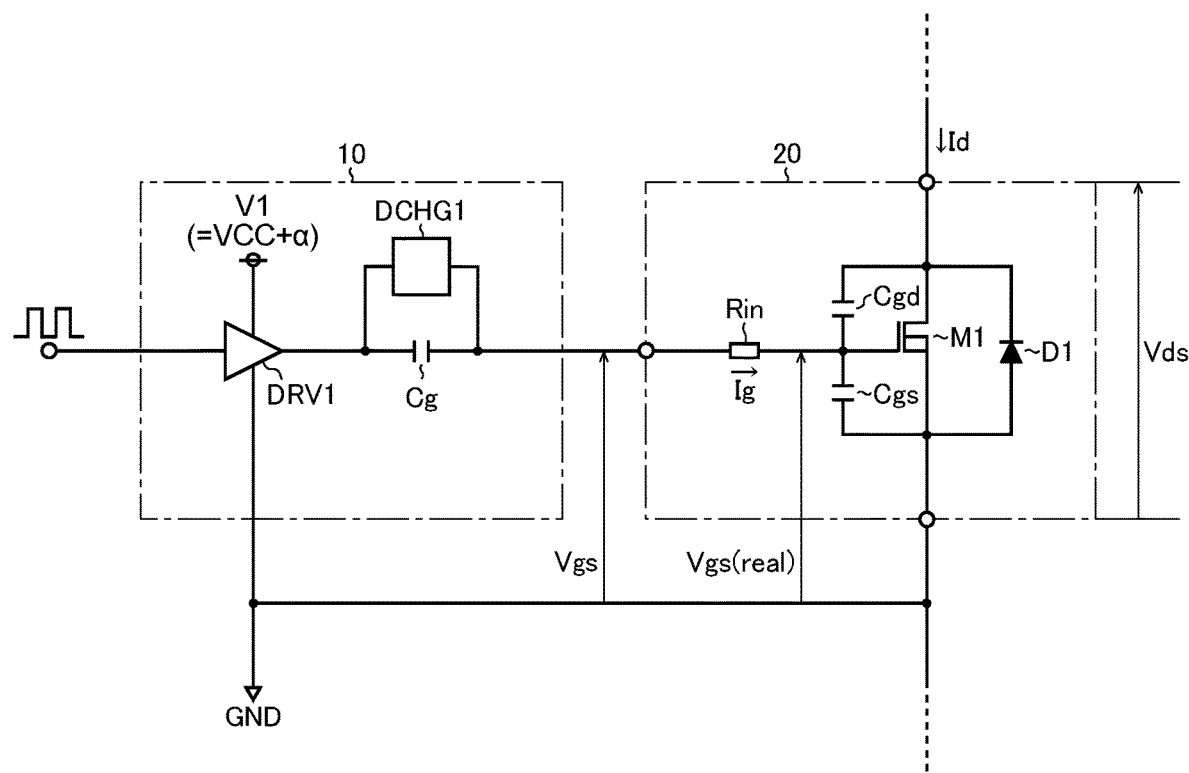
FIG. 7 is an equivalent circuit diagram showing a gate drive circuit according to a second embodiment.

FIG. 7 is an equivalent circuit diagram showing a gate drive circuit 10 according to a second embodiment. The gate drive circuit 10 according to this embodiment, while being based on the first embodiment (FIG. 4), further has a discharger DCHG1. The discharger DCHG1 is connected in parallel with the capacitor Cg, and discharges electric charge in the capacitor Cg when the switching device 20 is turned OFF. With such a configuration, it is possible, when the switching device 20 is turned OFF, to prevent a negative voltage from being applied to the gate terminal of the switching device 20 and to adjust as necessary the voltage applied to the gate terminal of the switching device 20.

Third Embodiment

Figure 8:
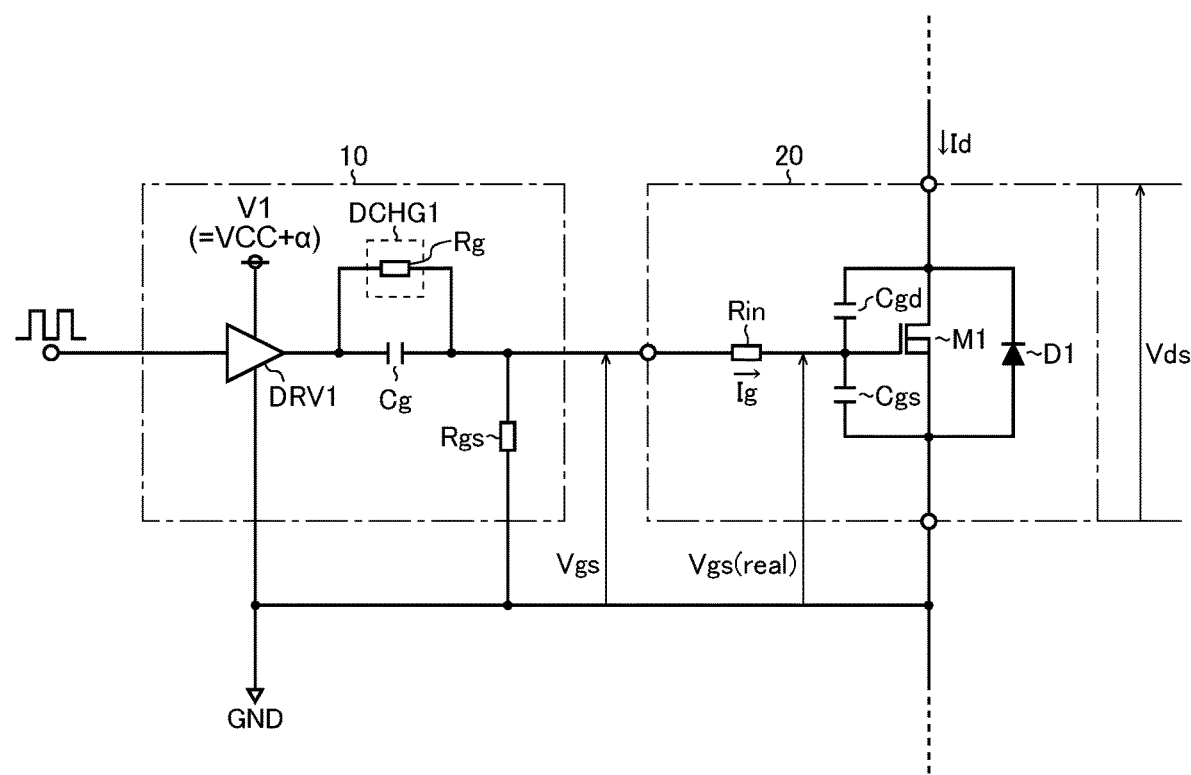
FIG. 8 is an equivalent circuit diagram showing a gate drive circuit according to a third embodiment.

FIG. 8 is an equivalent circuit diagram showing a gate drive circuit 10 according to a third embodiment. The gate drive circuit 10 according to this embodiment, while being based on the second embodiment (FIG. 7), includes a resistor Rg as the discharger DCHG1 and further has a resistor Rgs connected between the gate and source of the switching device 20.

Here, by previously adjusting the resistance values of the resistors Rg and Rgs such that Rg<Rgs holds, it is possible to apply, across the gate-source parasitic capacitance Cgs, a large part of the gate-source voltage Vgs applied when the switching device 20 is in the steady ON state. Adopting this configuration permits the electric charge stored in the capacitor Cg during the turn-ON period to apply a negative bias to the gate only for the moment of switching during the turn-OFF period; this makes it possible to increase the switching speed not only during the turn-ON period but also during the turn-OFF period. In the plateau region during the turn-OFF period, the voltage applied to the gate-source parasitic capacitance Cgs is Vp (>Vth), and thus cannot be negative; thus, this effect exerts a great influence on such a device that has a negative-side gate-source rated DC voltage close to zero and that cannot be left under steady application of a high negative bias.

In particular, when Rg, Rgs>>Rin holds and when Rin can be substantially ignored in the circuit, by previously adjusting the constants of the circuit components such that the relationship Cg:(Cg+Cgs)=(Rg//Rgs):Rg holds, it is possible to keep constant the voltage division capacitance ratio between the capacitance Cg and the gate-source parasitic capacitance Cgs without depending on the driving conditions (such as the driving frequency) of the switching device 20 or causing an unnecessary variation in voltage due to an imbalance in circuit constants. Even when Rg, Rgs>>Rin does not hold, by appropriately adjusting Rg, Rgs, and Cg with consideration given to Rin and Cgs, it is possible to obtain a similar effect.

For example, when Cgs=2 nF and Cg=30 nF, Rg and Rgs can be previously set at 1 kΩ and 15 kΩ respectively; then, irrespective of the driving conditions of the switching device 20, in the steady On state thereof, the source voltage VCC is applied across the gate-source parasitic capacitance Cgs, and the voltage α is applied across the capacitor Cg.

Fourth Embodiment

Figure 9:
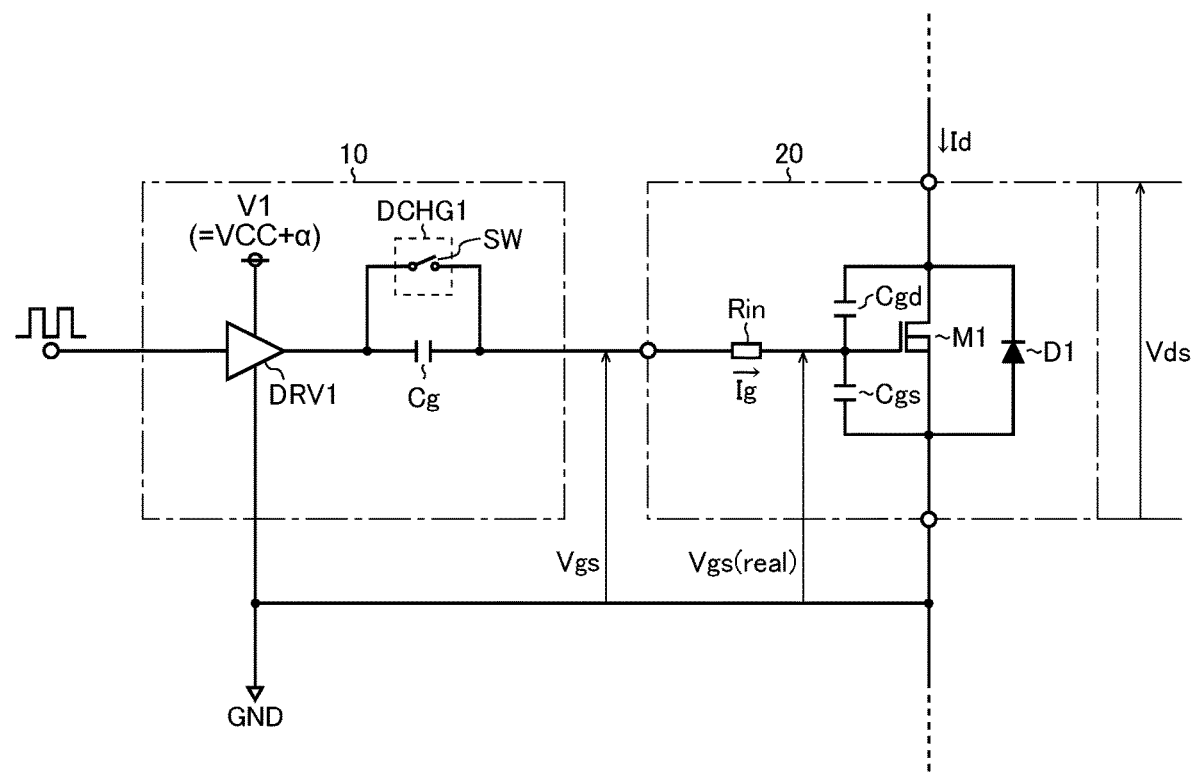
FIG. 9 is an equivalent circuit diagram showing a gate drive circuit according to a fourth embodiment.

FIG. 9 is an equivalent circuit diagram showing a gate drive circuit 10 according to a fourth embodiment. The gate drive circuit 10 according to this embodiment, while being based on the second embodiment (FIG. 7), includes a switch SW as the discharger DCHG1. With such a configuration, except when the switching device 20 turns OFF, it is possible to keep the electric charge stored in the capacitor Cg without discharging it by keeping the switch SW OFF; on the other hand, when the switching device 20 turns OFF, it is possible to speedily discharge the electric charge stored in the capacitor Cg by turning the switch SW ON.

Fifth Embodiment

Figure 10:
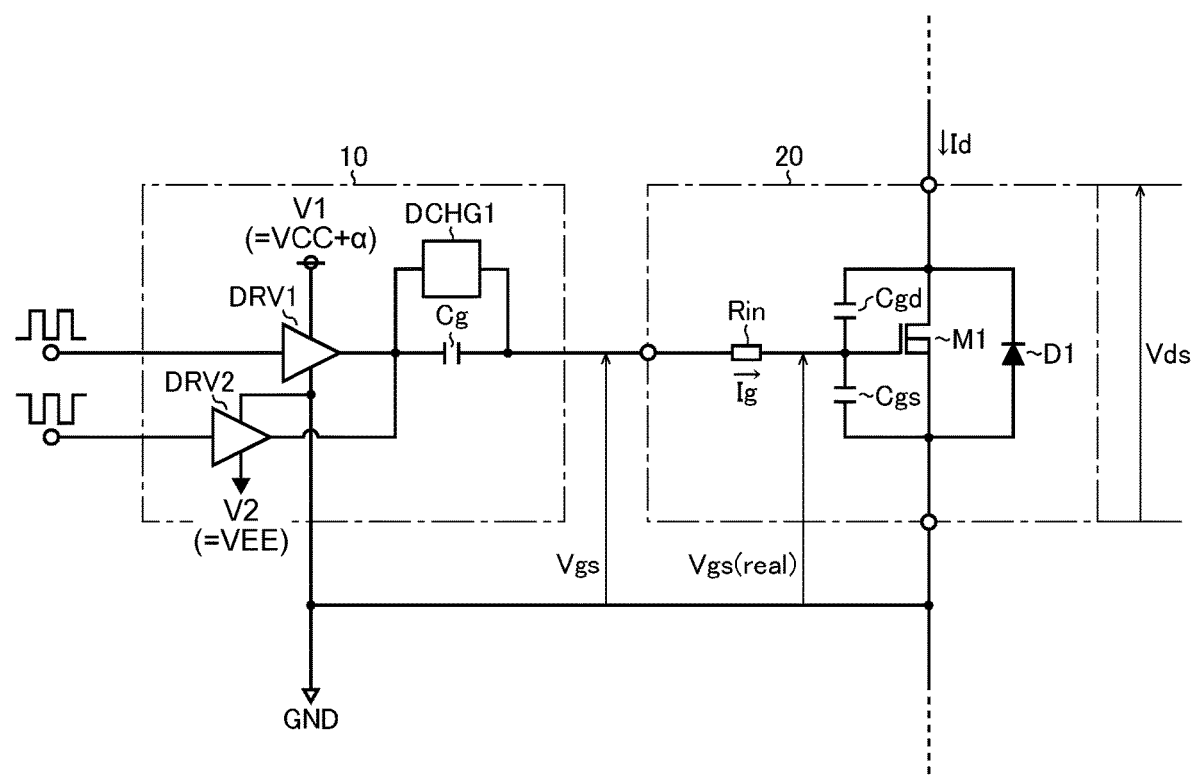
FIG. 10 is an equivalent circuit diagram showing a gate drive circuit according to a fifth embodiment.

FIG. 10 is an equivalent circuit diagram showing a gate drive circuit 10 according to a fifth embodiment. The gate drive circuit 10 according to this embodiment, while being based on the second embodiment (FIG. 7), further has a driver DRV2. Its addition is coped with by some change in the operation of the driver DRV1.

The driver DRV1 switches its output state, according to the logic level of a control signal fed to it, between a first state ((VCC+α) output state) and a second state (Hi-Z state). The driver DRV2 switches its output state, according to the logic level of a reverse control signal (corresponding to the logic reverse signal of a control signal) fed to it, between a first state (Hi-Z state) and a second state (VEE output state). As the drivers DRV1 and DRV2 that so operate, a three-state buffer, a three-state inverter, or the like can be used.

A gate drive voltage source V2 feeds a negative-side gate drive voltage VEE (for example, −2 V) to the driver DRV2. The negative-side gate drive voltage VEE has only to satisfy the inequality: (Negative-side gate-source rated DC voltage) <VEE≤GND.

By adopting such a configuration, it is possible to separate a turn-ON drive passage and a turn-OFF drive passage from each other, and thus to set the gate-source voltage Vgs observed when the switching device 20 is OFF at a voltage value that does not vary with the positive-side gate drive voltage (VCC+α) (that is, a voltage value which is not −α). Thus, application of a high bias can be prevented, and thus the gate can be voltage-driven with consideration given to the negative-side rated DC voltage.

Sixth Embodiment

Figure 11:
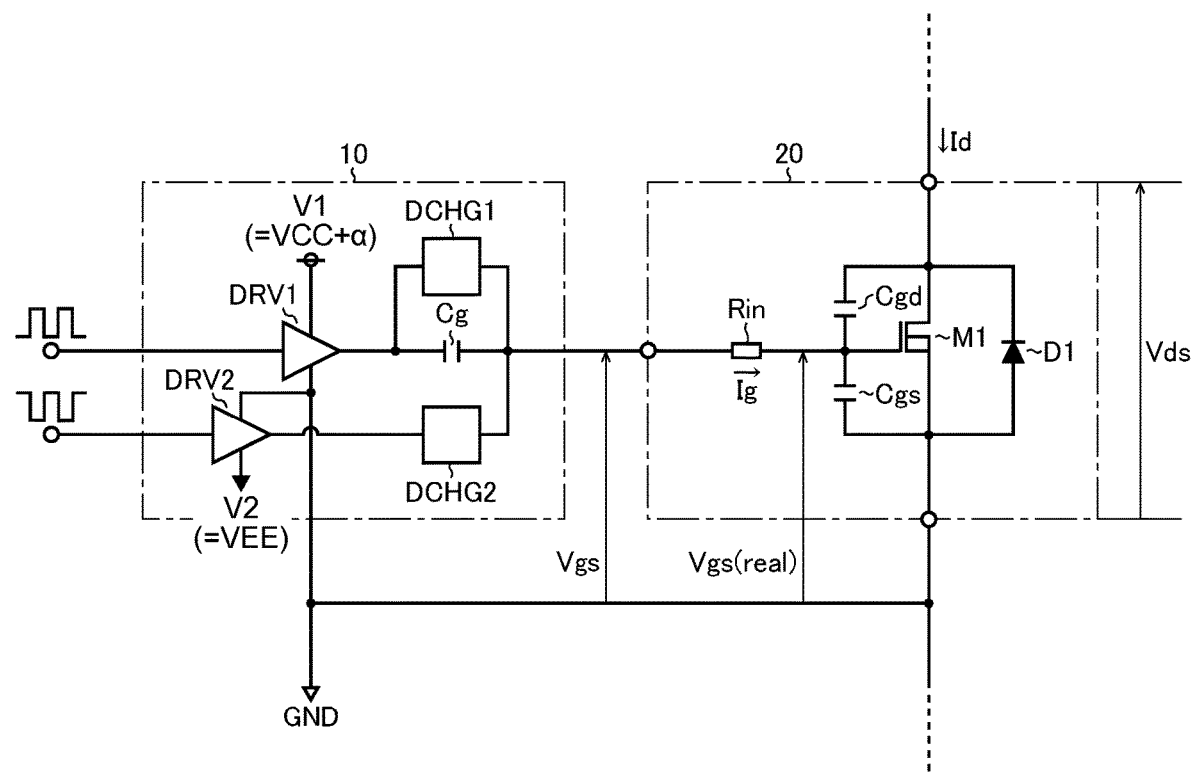
FIG. 11 is an equivalent circuit diagram showing a gate drive circuit according to a sixth embodiment.

FIG. 11 is an equivalent circuit diagram showing a gate drive circuit 10 according to a sixth embodiment. The gate drive circuit 10 according to this embodiment, while being based on the fifth embodiment (FIG. 10), further has a discharger DCHG2. The discharger DCHG2 is connected between an output terminal of the driver DRV2 and the gate terminal of the switching device 20.

By adopting such a configuration, it is possible to design the discharge condition for the turn-OFF period separately from that for the turn-ON period.

Seventh Embodiment

Figure 12:
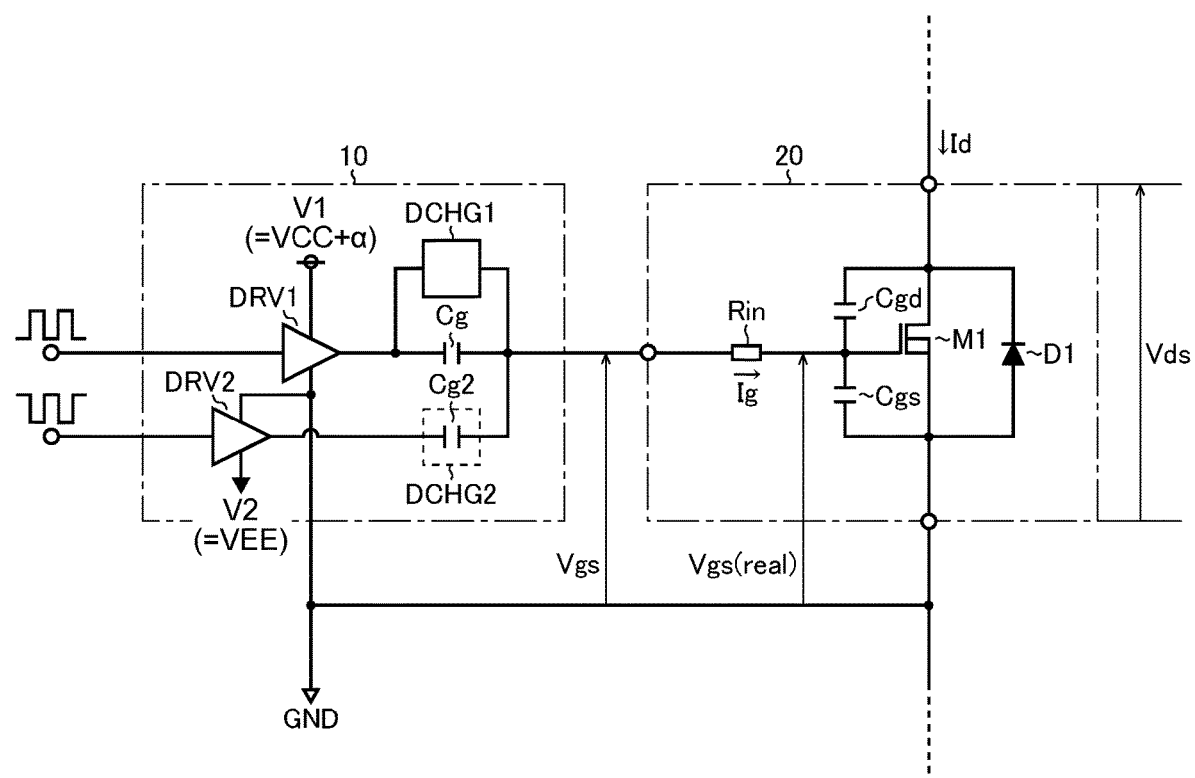
FIG. 12 is an equivalent circuit diagram showing a gate drive circuit according to a seventh embodiment.

FIG. 12 is an equivalent circuit diagram showing a gate drive circuit 10 according to a seventh embodiment. The gate drive circuit 10 according to this embodiment, while being based on the sixth embodiment (FIG. 11), includes a capacitor Cg2 as the discharger DCHG2. When the discharger DCHG2 is a capacitor Cg2 as just mentioned, it is possible to increase the speed of the turning-OFF operation of the switching device 20.

Eighth Embodiment

Figure 13:
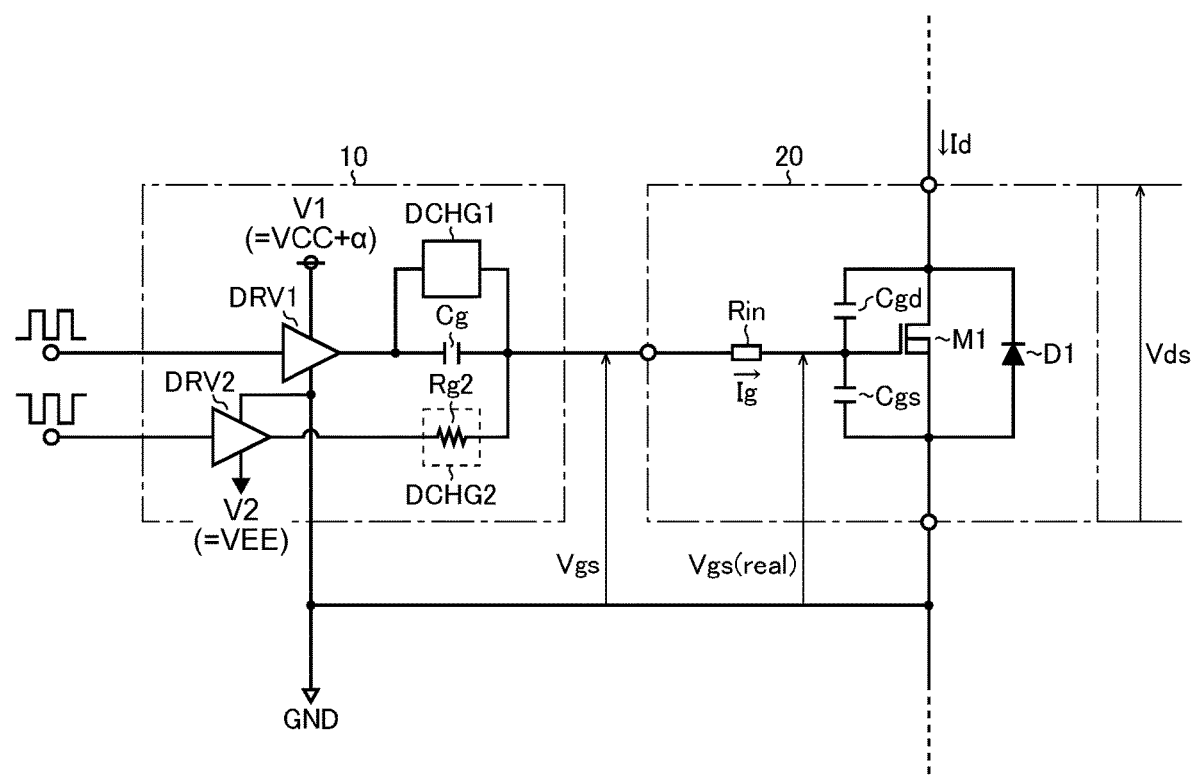
FIG. 13 is an equivalent circuit diagram showing a gate drive circuit according to an eighth embodiment.

FIG. 13 is an equivalent circuit diagram showing a gate drive circuit 10 according to an eighth embodiment. The gate drive circuit 10 according to this embodiment, while being based on the sixth embodiment (FIG. 11), includes a resistor Rg2 as the discharger DCHG2. When there is no need to increase the speed of the turning-OFF operation of the switching device 20, it is possible to use a resistor Rg2 as the discharger DCHG2 as mentioned above.

Ninth Embodiment

Figure 14:
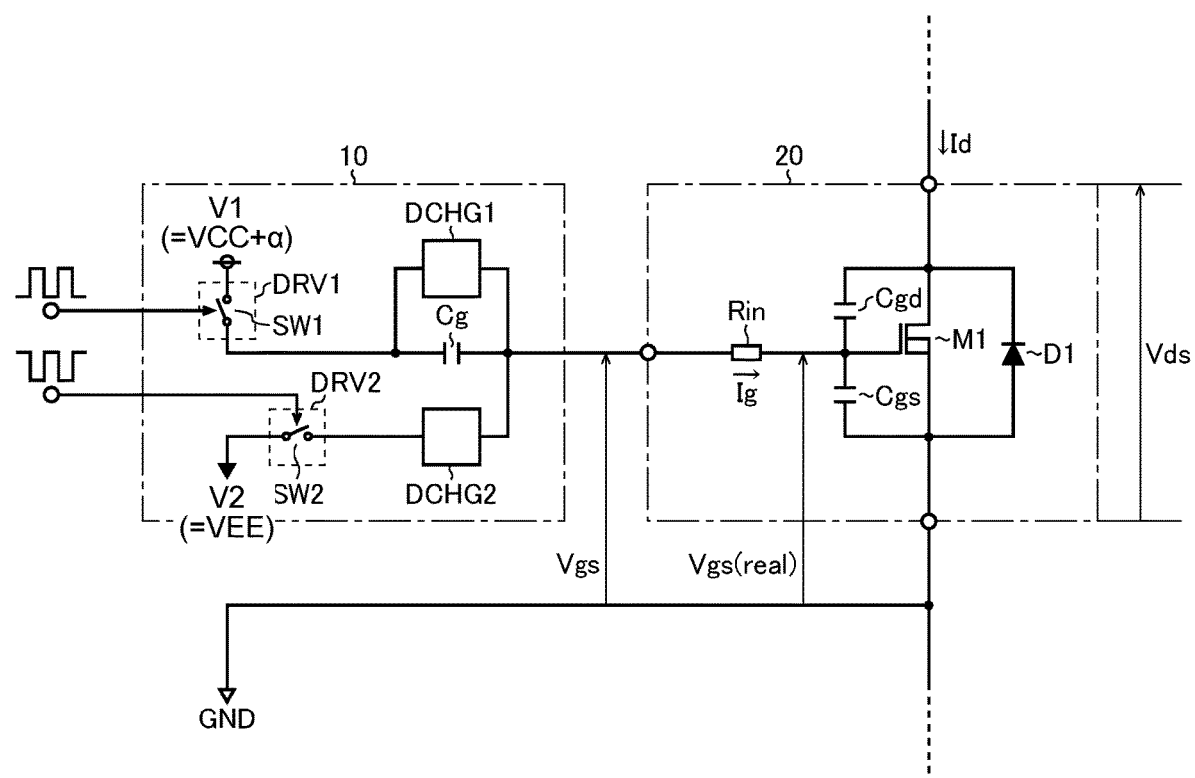
FIG. 14 is an equivalent circuit diagram showing a gate drive circuit according to a ninth embodiment.

FIG. 14 is an equivalent circuit diagram showing a gate drive circuit 10 according to a ninth embodiment. The gate drive circuit 10 according to this embodiment, while being based on the sixth embodiment (FIG. 11), includes switches SW1 and SW2 as the drivers DRV1 and DRV2 respectively.

As mentioned previously, the driver DRV1 has only to switch its output state, according to a control signal fed to it, between the first state ((VCC+α) output state) and the second state (Hi-Z state). This makes it possible to easily achieve the function of the driver DRV1 by use of the switch SW1 that turns ON and OFF between, at one end, the gate drive voltage source V1 and, at the other end, the capacitor Cg and the discharger DCHG1.

Likewise, the driver DRV2 has only to switch its output state, according to a reverse control signal fed to it, between the first state (Hi-Z state) and the second state (VEE output state). This makes it possible to easily achieve the function of the driver DRV2 by use of the switch SW2 that turns ON and OFF between the gate drive voltage source V2 and the discharger DCHG2.

Other Modifications

Various technical features disclosed herein can be implemented in any manner other than specifically described by way of embodiments above, and allow for many modifications within the spirit of the technical ingenuity involved. That is, it should be understood that the embodiments disclosed herein are in every aspect illustrative and not restrictive, and that the technical scope of the present invention is defined not by the description of embodiments given above but by the scope of the appended claims and encompasses any modification in the sense and scope equivalent to those of the claims.

INDUSTRIAL APPLICABILITY

The gate drive circuit disclosed herein is used, for example, as a means for driving a switching device such as a switching power source or a motor driver, and finds wide application in various fields, for example, in the fields of home appliances, industrial machines, etc.

What is claimed is:
1. A gate drive circuit, comprising:
a first capacitor and a first gate drive voltage source connected in series with a gate terminal of a switching device of a voltage-driven type, and
a first resistor connected in parallel with the first capacitor, the first resistor being configured to discharge the first capacitor when the switching device is OFF as a first discharger, wherein
the switching device includes a gate-source (emitter) parasitic capacitance and an inner gate resistance,
the first gate drive voltage source is configured to feed, as a first gate drive voltage, a voltage higher than a sum of a power supply voltage applied to the gate-source (emitter) parasitic capacitance of the switching device when the switching device is in a steady ON state and a voltage applied to, of any circuit component interposed between the first gate drive voltage source and the gate terminal of the switching device, a circuit component other than the first capacitor, and wherein
the gate drive circuit further comprises a second resistor connected between a gate and a source (emitter) of the switching device, and wherein
for a resistance value Rg of the first resistor and a resistance value Rgs of the second resistor, a relationship of Rg<Rgs holds, and right after the switching device turns ON, the first gate drive voltage is applied as a gate-source (emitter) voltage of the switching device, and a voltage across the gate-source (emitter) parasitic capacitance of the switching device rises from a zero value, and when the switching device reaches the steady ON state, both of the gate-source (emitter) voltage of the switching device and the voltage across the gate-source (emitter) parasitic capacitance of the switching device settle at the power supply voltage.

2. The gate drive circuit of claim 1, wherein for a capacitance value Cg of the first capacitor, a capacitance value Cgs of the gate-source (emitter) parasitic capacitance observed when the switching device is in the steady ON state, and a resistance value Rgs of the second resistor, a relationship of Cg:(Cg+Cgs)=(Rg∥Rgs):Rg holds.

3. The gate drive circuit of claim 1, further comprising:
a second gate drive voltage source connected to a first gate drive voltage source side of the first discharger.

4. The gate drive circuit of claim 1, further comprising:
a second discharger of which a first terminal is connected to the gate terminal of the switching device; and
a second gate drive voltage source connected to a second terminal side of the second discharger.

5. The gate drive circuit of claim 4, wherein the second discharger includes a second capacitor.

6. The gate drive circuit of claim 4, wherein the second discharger includes a third resistor.

7. The gate drive circuit of claim 1, wherein the switching device is a SiC-MOSFET.

* * * * *